(12) United States Patent
Nonogaki et al.

(10) Patent No.: US 8,040,034 B2
(45) Date of Patent: Oct. 18, 2011

(54) ELECTRON SOURCE

(75) Inventors: Ryozo Nonogaki, Shibukawa (JP); Yoshinori Terui, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 102 days.

(21) Appl. No.: 12/667,762

(22) PCT Filed: Jun. 19, 2008

(86) PCT No.: PCT/JP2008/061233
§ 371 (c)(1),
(2), (4) Date: Jan. 5, 2010

(87) PCT Pub. No.: WO2009/008254
PCT Pub. Date: Jan. 15, 2009

(65) Prior Publication Data
US 2010/0194262 A1    Aug. 5, 2010

(30) Foreign Application Priority Data

Jul. 12, 2007  (JP) .................... 2007-183452

(51) Int. Cl.
*H01J 1/16* (2006.01)
(52) U.S. Cl. ........................ 313/336; 313/351
(58) Field of Classification Search .......... 313/309, 313/336, 351, 495
See application file for complete search history.

(56) References Cited

U.S. PATENT DOCUMENTS

| 1,850,981 | A | * | 3/1932 | Potter | .................... 313/245 |
| 6,680,562 | B1 | | 1/2004 | McGinn et al. | |
| 7,556,749 | B2 | | 7/2009 | Terui et al. | |
| 2006/0145585 | A1 | | 7/2006 | Terui et al. | |
| 2006/0226753 | A1 | | 10/2006 | Adamec et al. | |

FOREIGN PATENT DOCUMENTS

| JP | 3 192643 | 8/1991 |
| JP | 2001 52596 | 2/2001 |
| JP | 2003 507872 | 2/2003 |
| JP | 2006 269431 | 10/2006 |
| JP | 2008 91307 | 4/2008 |

OTHER PUBLICATIONS

Tuggle, D. et al., "Application of a Thermal Field Emission Source for High Resolution, High Current E-Beam Microprobes", J.Vac.Sci. Technol., vol. 16, No. 6, pp. 1699-1703 (Nov./Dec. 1979).
U.S. Appl. No. 12/597,961, filed Oct. 28, 2009, Terui, et al.

\* cited by examiner

*Primary Examiner* — Vip Patel
(74) *Attorney, Agent, or Firm* — Oblon, Spivak, McClelland, Maier & Neustadt, L.L.P.

(57) ABSTRACT

An electron source producing an electron beam which is highly reliable and stable even when it is externally oscillated. The electron source comprises a cathode (1) having an electron emitting section which is so connected to be interposed between top ends of two filaments (3) which are respectively connected to two conductive pins (4) provided on an insulator member (5), an end of the cathode (1) which differs from the electron emitting section being fixed to the insulator member (5), wherein the two filaments (3) are being twofold symmetry with a center on a center axis of the cathode (1), and preferably, the end of the cathode (1) which differs from the electron emitting section is fixed to the insulator member (5) via a metallic member (6) brazed to the insulator member, and more preferably, a curved portion is provided to the filaments.

4 Claims, 4 Drawing Sheets

ELECTRON SOURCE

TECHNICAL FIELD

The present invention relates to an electron source.

BACKGROUND ART

In recent years, electron sources using cathodes with monocrystalline tungsten needle electrodes having coating layers of zirconium and oxygen (hereinafter referred to as ZrO/W electron sources) have been used to obtain electron beams that are brighter and have a longer operating life than hot cathodes (see Non-Patent Document 1).

ZrO/W electron sources are obtained by providing a reservoir consisting of zirconium and oxygen on a needle cathode composed of tungsten monocrystals having an axial orientation in the <100> orientation, so that the zirconium and oxygen are diffused to form a coating layer (hereinafter referred to as a ZrO coating layer), said ZrO coating layer reducing the work function of the (100) plane of the tungsten monocrystals from 4.5 eV to about 2.8 eV, so that only the tiny crystalline facet corresponding to the (100) plane formed at the tip of this cathode forms an electron emission region, as a result of which an electron beam that is brighter than that of conventional thermionic cathodes can be obtained, and the operating life is also prolonged.

As shown in FIG. 1, a ZrO/W electron source comprises a needle cathode 1 of tungsten in the <100> orientation for emitting an electron beam attached by welding or the like at a predetermined position on a tungsten filament 3 provided on a conductive terminal 4 anchored to insulator 5. A reservoir 2 of zirconium and oxygen is formed in a portion of the cathode 1.

The tip portion of the cathode 1 of the ZrO/W electron source is positioned between a suppressor electrode and an extractor electrode for use. The cathode 1 is electrically heated to about 1800 K by means of the filament 3, and generally, a high negative voltage is applied to the cathode 1 against the extractor electrode, while a negative voltage of a few hundred volts is applied to the suppressor electrode against the cathode 1, suppressing thermal electrons issuing from the filament 3.

While ZrO/W electron sources are widely used in critical dimension SEM and wafer inspection equipment at low accelerating voltages, when observing SEM images at relatively high optical system magnifications, vibrations from around the equipment can generate noise, thus reducing the resolution, sometimes to such a degree that measurements are not possible. This noise is known to be caused by vibration of the tungsten filament of the ZrO/W electron source at a resonance frequency.

Non-Patent Document 1: D. Tuggle, *J. Vac. Sci. Technol.*, 16, p. 1699 (1979).

DISCLOSURE OF THE INVENTION

Problems to be Solved by the Invention

With the aim of suppressing the above-described vibrations, the present inventors have invented and filed an application for an electron source having a structure wherein an end of the cathode different from the electron emitting source is affixed to an insulator. However, they have come to realize that with such a structure, while the filament thermally expands when the filament is heated, the cathode is affixed to the insulator, so the cathode and filaments themselves are subjected to stress, causing the cathode or filaments to plastically deform and thereby reducing reliability. Therefore, the present inventors have proposed providing curved portions on the filament, so that the stress generated by thermal expansion can be relieved by these curved portions, thereby preventing plastic deformation of the cathode and filament. However, while this structure eliminates the problem of the cathode coming into contact with the suppressor electrode, slight displacements when heating the cathode can prevent the suppressor electrode from adequately achieving the effect of suppressing emission of thermal electrons from the filament, so that excess electrons may be emitted through the hole in the suppressor. The present inventors performed various studies in view of the above circumstances, as a result of which they discovered that the slight displacements when heating the cathode are due to the cathode being attached to the side surface of the filament, thereby leading them to the present invention.

The purpose of the present invention is to offer an electron source with a structure wherein an end of the cathode different from the electron emitting portion is attached to insulator, so that when the electron source is practically applied, it does not undergo deformations wherein the cathode becomes displaced from the central axis, thereby providing a stable, highly reliable electron beam.

Means for Solving the Problems

The present invention is an electron source characterized by comprising a cathode having an electron emitting portion, connected between tips of two filaments respectively affixed to two conductive terminals provided on insulator, an end of said cathode different from the electron emitting portion being anchored to said insulator, and said two filaments having 2-fold rotational symmetry with respect to a central axis of said cathode.

The electron source having the above structure is such that when the electron source is practically applied, even if the cathode is heated and the filaments thermally expand, the stresses will act evenly on the cathode, so that the cathode will not become deformed and displaced from the central axis, resulting in a stable and highly reliable electron beam.

Effects of the Invention

The electron source of the present invention is such that when the electron source is practically applied, a stable and highly reliable electron beam is obtained.

Figure 1:
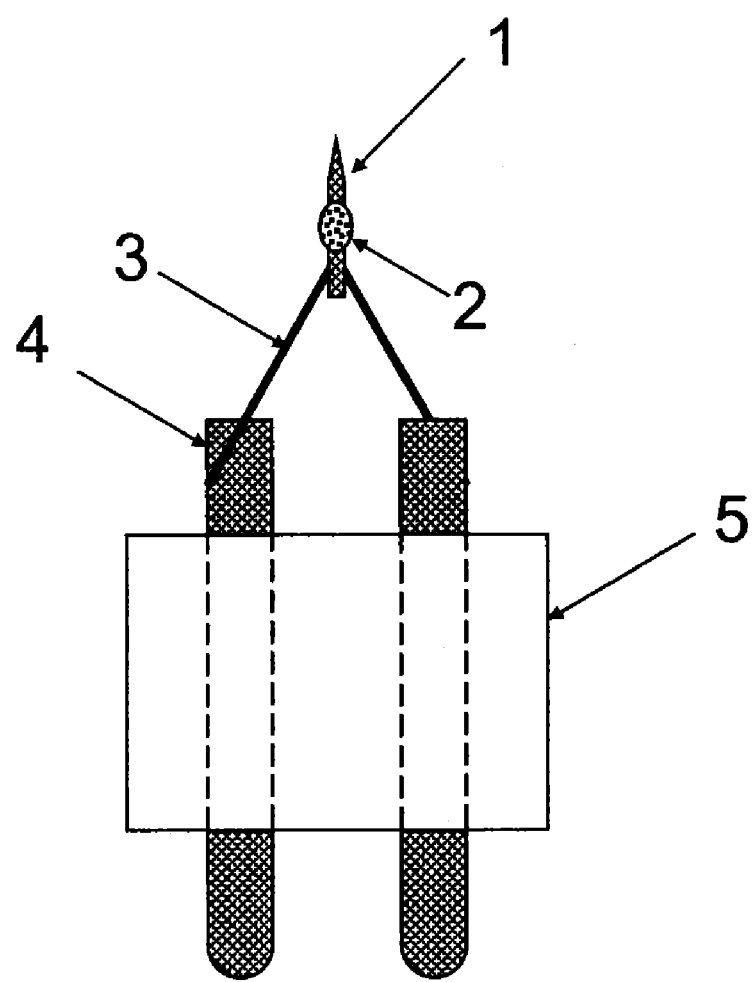
FIG. 1 Structural diagram of a conventionally known electron source.

DESCRIPTION OF THE REFERENCE NUMBERS 1 cathode
2 reservoir 3 filament
4 conductive terminal
5 insulator
6 metallic member
7 suppressor electrode
8 extractor electrode
9 fluorescent screen
10 filament-heating power supply
11 bias power supply
12 high-voltage power supply
13 emitted electron beam

BEST MODES FOR CARRYING OUT THE
INVENTION

<Explanation of Terminology>

In the present specification, "2-fold rotational symmetry" refers to the case where a shape is the same as the original shape after a rotation of 180 degrees with the central axis as the axis of symmetrical rotation. In other words, "the two filaments have 2-fold rotational symmetry with respect to the central axis of the cathode" means that when the electron source is viewed from the direction of emission of the electron beam, the filament has 2-fold rotational symmetry centered about the central axis of the cathode. However, there is no need for the positions of the filaments to have perfect 2-fold rotational symmetry, and there may be some deviation depending on the conditions at the time of production and the materials used.

Herebelow, a specific embodiment of the present invention shall be explained with reference to FIG. 2.

Figure 2:
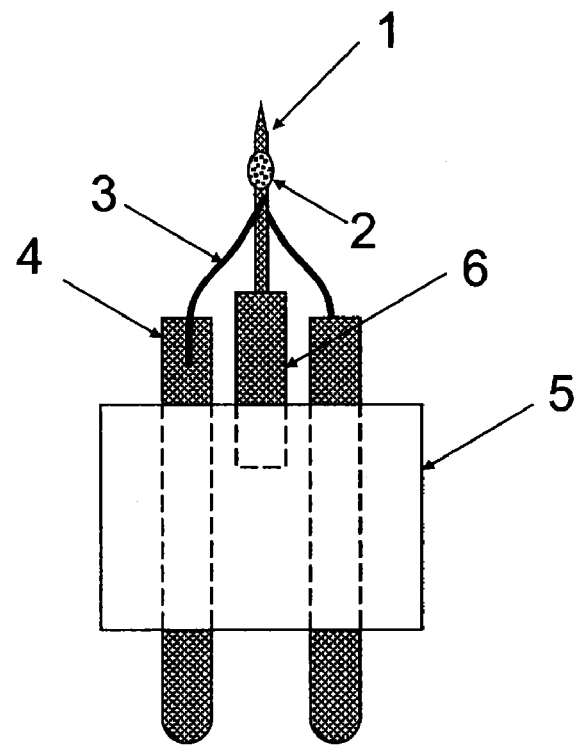
FIG. 2 Structural diagram of an example of an electron source according to the present invention.

As shown in FIG. 2, the electron source of the present embodiment has two identically shaped filaments 3 consisting of a tungsten or tungsten alloy wire attached to conductive terminals 4 anchored to insulator 5. A monocrystalline needle 1 of tungsten in the <100> orientation which emits an electron beam is provided at the tips of the filaments 3. That is, the present invention relates to an electron source applicable to scanning electron microscopy, Auger electron spectroscopy, electron beam lithography, wafer inspection equipment and the like.

The electron source of the present embodiment is characterized in that an end portion of the cathode 1 different from the electron emitting portion is anchored to the insulator 5. Here, "end portion different from the electron emitting portion of the cathode 1" refers, for example, to the end portion opposite to the pointed electron emitting portion, which is anchored to the metallic member 6 in FIG. 2.

By using such a structure, the electron source of the present embodiment is able to keep noise caused by resonation of the cathode with external vibrations very small, as a result of which equipment using this electron source is capable of achieving high resolutions without providing anti-vibration structures on the outside thereof, thus enabling high reliability to be achieved at a low cost.

Figure 3:
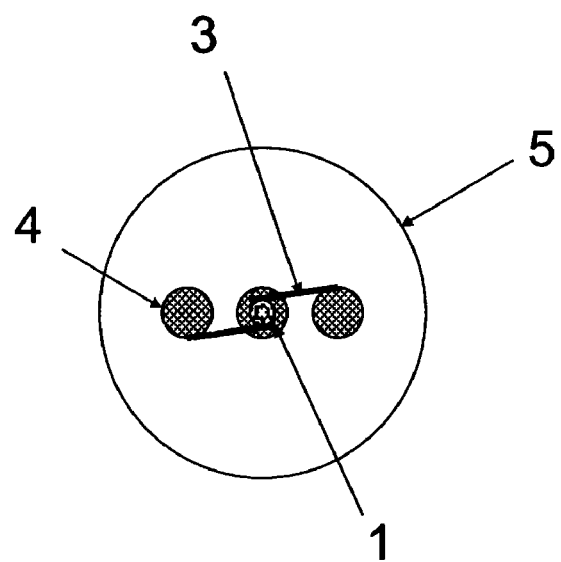
FIG. 3 Structural diagram of an electron source according to the present invention (viewing the electron source of FIG. 2 from the direction of the needle tip).

Additionally, the electron source of the present embodiment is characterized in that the two filaments have 2-fold rotational symmetry with respect to the central axis of the cathode 1, as shown in FIG. 3.

[Shape of Filaments]

As for the shapes of the filaments 3, they preferably have a curved portion between the portion of attachment to the cathode 1 and the portion where they are affixed to the metallic member 6. In other words, while the filaments 3 will thermally expand when electrically heated, since the cathode 1 is anchored to the insulator 5, the cathode 1 and the filaments 3 themselves will be subjected to stresses, as a result of which the cathode 1 or filaments 3 can be deformed, thereby changing the spatial positioning of the cathode, affecting the electron beam and reducing the reliability.

By providing curved portions in the filaments 3 beforehand as in the electron source of the present embodiment, the stresses caused by thermal expansion can be relieved by the curved portions, thus preventing deformation of the cathode 1 and filaments 3, leaving the spatial positioning of the cathode unaffected, and consequently enabling a highly reliable electron source to be offered.

While the filaments 3 in FIG. 2 curve in the form of an "S", the present invention shall not be construed as being limited thereto. In other words, it is sufficient for the filaments to have a curved portion between the portion of attachment to the cathode 1 and the portion where they are affixed to the metallic member 6, and there may be a plurality of curved portions.

[Symmetry of Filaments]

In the present embodiment, the effects can be achieved as long as the filaments are rotationally symmetric, but electrical heating of the filaments only requires a minimum of two filaments, and if they are made 3-fold rotationally symmetric or more, then there is the technical problem that it becomes less easy to maintain the balance between the filaments.

Therefore, in the present invention, the filaments 3 are chosen to have 2-fold rotational symmetry with respect to the central axis of the cathode 1. As a result, when the electron source actually applied, even if the heat from the cathode 1 causes the filaments 3 to thermally expand, the stresses will affect the cathode 1 evenly, as a result of which deformations that can cause axial displacement with respect to the central axis of the cathode will not occur, and the effects of a suppressor electrode for suppressing emission of thermal electrons from the filament 3 can be adequately achieved, making it much easier to obtain a stable and highly reliable electron beam.

Additionally, the electron source of the present embodiment has a cathode consisting of monocrystals of molybdenum or tungsten in the <100> orientation, and a portion of the cathode may have oxides of metal elements chosen from among Ca, Sr, Ba, Sc, Y, La, Ti, Zr, Hf and the lanthanoids as a reservoir.

<Production Method>

Next, a method of producing the electron source of the present invention shall be described.

First, two similarly shaped filaments 3 consisting of tungsten or a tungsten alloy are respectively attached by welding to conductive terminals 4 anchored to insulator 5. Next, a monocrystalline needle 1 of tungsten in the <100> orientation which emits an electron beam was affixed by welding between the tips of the filaments 3 at a position where the filaments 3 overlap. As a result of the above operations, an electron source wherein two filaments have 2-fold rotational symmetry with respect to the central axis of a cathode 1 can be produced as shown in FIG. 3.

Furthermore, the end of the cathode 1 different from the electron-emitting portion is anchored to the insulator 5. As means for forming such a structure, a method of anchoring by welding the cathode 1 to a metallic member 6 affixed to the insulator 5 by means such as brazing is simple and therefore preferred. The metallic member 6 can be attached to the insulator 5 at a single location in the center.

The structure obtained by the above operation is next subjected to sharpening of the tip of the cathode by electrolytic polishing, a zirconium source is formed on the side surface of the central portion thereof and heated in the presence of oxygen at a pressure of about $10^{-4}$ Pa, so as to diffuse zirconium and oxygen to the tip of the cathode 1 (hereinafter referred to as oxygen treatment). Then, the electrodes are attached to apply a voltage in a vacuum of about $10^{-7}$ Pa, thereby forming the shape of the tip of the cathode 1.

<Functions and Effects>

The functions and effects of the electron source according to the present embodiment shall be explained.

With the electron source of the present embodiment, the end of the cathode 1 different from the electron-emitting portion is anchored to the insulator 5 via a metallic member 6 brazed to the insulator. By doing so, noise caused by resonation of the cathode with external vibrations can be held very small, and devices using this electron source are able to achieve high resolutions without being provided with any anti-vibration structures on the outside, enabling high reliability to be achieved at a low cost.

Furthermore, when the electron source having the above structure is to be applied, the cathode is heated and the filament thermally expands, so that the stresses act evenly on the cathode, and the cathode will not be deformed such as to become displaced from the central axis, enabling a stable and reliable electron beam to be obtained.

Additionally, both of the two filaments 3 may be provided with a curved portion between the portion of connection to the cathode 1 and the portion of anchoring to the conductive terminal 4. By doing so, it is possible to prevent plastic deformation of the cathode 1 and the filaments 3, without affecting the spatial arrangement of the cathode, consequently providing a highly reliable electron source.

Additionally, the cathode 1 may consist of monocrystals of molybdenum or tungsten in the <100> orientation, and the cathode 1 may have oxides of metal elements chosen from among Ca, Sr, Ba, Sc, Y, La, Ti, Zr, Hf and lanthanoids as a reservoir 2. By using these metal elements in the cathode 1 and the reservoir 2, it is possible to stably obtain very bright electron emissions for a long period of time, thus resulting in an electron source with desirable properties.

In order to suppress vibration of filaments, the present inventors have invented and filed an application (Japanese Patent Application No. 2006-240100) for an electron source having a structure wherein the end of a cathode different from the electron-emitting portion is anchored to insulator. With this structure, the filaments will thermally expand when the filaments are heated, but since the cathode is anchored to the insulator, the cathode and filaments themselves will be subjected to stress, leaving open the possibility of plastic deformation of the cathode or filaments, and therefore having inadequate reliability.

Additionally, the present inventors have proposed to prevent plastic deformation of a cathode and filaments by providing curved portions in the filaments to relieve the stresses generated by thermal expansion by means of these curved portions, so as to prevent plastic deformation of the cathode and filaments (Japanese Patent Application No. 2006-285864). However, although this structure will eliminate problems such as the cathode coming into contact with the suppressor electrode, tiny displacements when heating the cathode can make it impossible for the suppressor electrode to adequately achieve the effect of suppressing emission of thermal electrons from the filaments, and excess electrons may be radiated through the hole in the suppressor.

While the present invention has been explained above giving the examples of electron-emitting cathodes used in electron microscopy, electron beam lithography and critical dimension SEM, the present invention is not limited to these applications.

EXAMPLES

Herebelow, the present invention will be described in further detail by giving examples and comparative examples. However, the present invention is not limited thereto.

Examples

Two tungsten filaments 3 having an S-shaped curve were affixed by spot welding to a pair of conductive terminals 4 brazed to an insulator 5 as shown in FIG. 2. Then, a cathode 1 of monocrystalline tungsten with a <100> orientation was attached by spot welding between the two filaments 3, such that the filaments 3 had 2-fold rotational symmetry with respect to the central axis of the cathode 1 as shown in FIG. 3. Furthermore, the end of the cathode 1 different from the electron-emitting portion was attached by spot welding to a metallic member 6 anchored to a central portion of the insulator 5.

Next, the tip portion of the cathode 1 was sharpened by electrolytic polishing. Next, hydrogenated zirconium was crushed and mixed with isoamyl acetate to form a paste, which was then applied to a portion of the cathode 1 and heated in the presence of oxygen at a pressure of about $10^{-4}$ Pa to perform an oxygen treatment, thereby resulting in an electron source structure having the structure shown in FIG. 2.

Comparative Example

Figure 4:
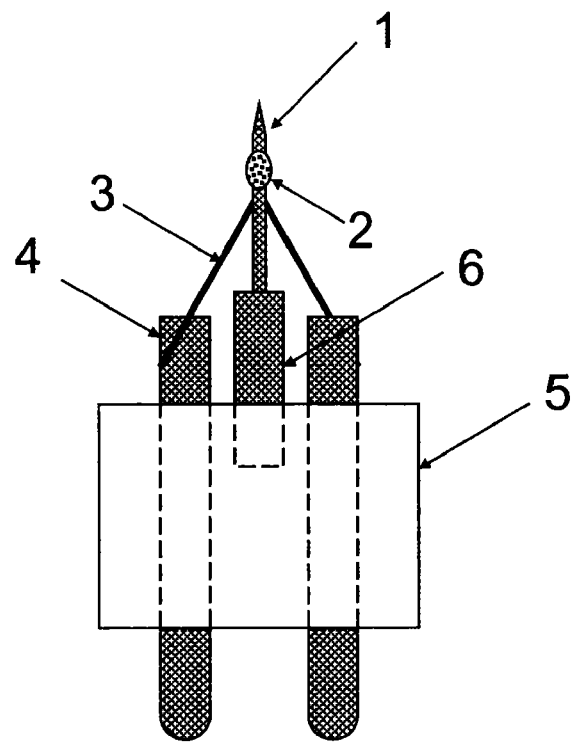
FIG. 4 Structural diagram of an electron source according to a comparative example.
Figure 5:
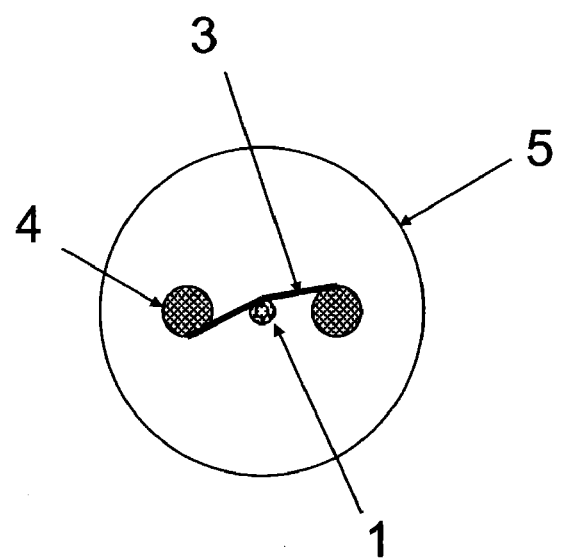
FIG. 5 Structural diagram of an electron source according to a comparative example (viewing the electron source of FIG. 4 from the direction of the needle tip).

As shown in FIG. 4, a single V-shaped filament 3 was formed between a pair of conductive terminals 4 brazed to insulator, and a cathode 1 was attached to the side surface thereof. An electron source structure was prepared by the same method as the example, apart from the fact that the cathode 1 was attached by spot welding to the side surface of the filament 3 as shown in FIG. 5.

[Evaluation of Electron Emission Property]

In order to perform an evaluation of the electron emission properties, an apparatus having the following structure was used to perform experiments.

[Structure of Evaluation Apparatus]

Figure 6:
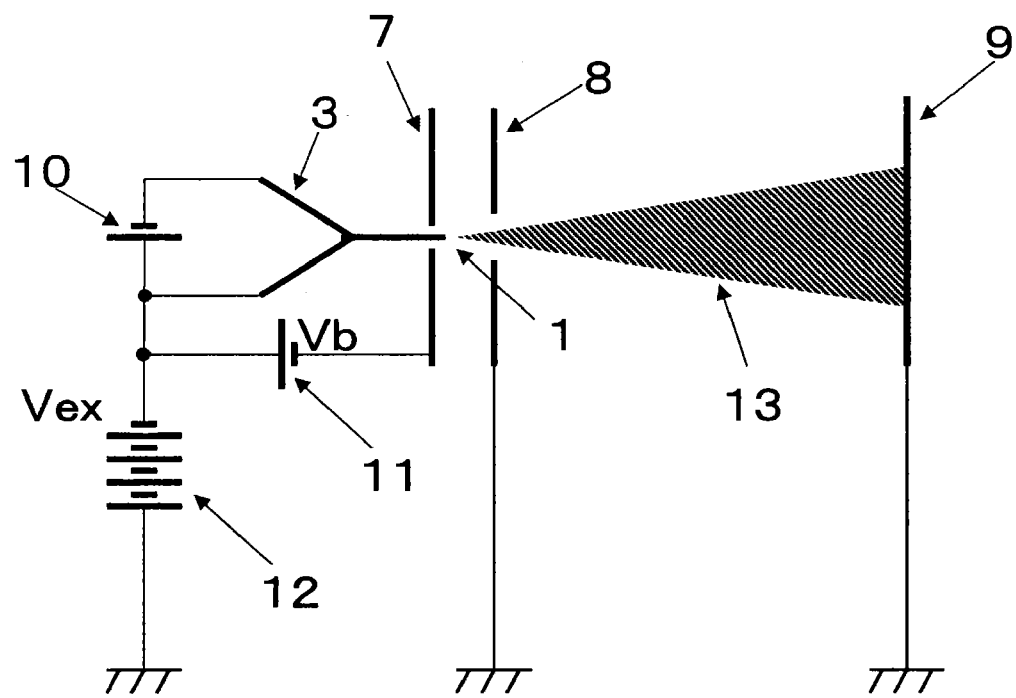
FIG. 6 Schematic diagram of an apparatus for evaluating electron emission properties.

As shown in FIG. 6, the tip of the cathode 1 is positioned between a suppressor electrode 7 and an extractor electrode 8. The cathode 1 is connected to a filament heating power supply 10, and further connected to a high-voltage power supply. A negative high voltage is applied to the extractor electrode 8. Additionally, the suppressor electrode 7 is connected to a bias power supply 12, and a negative voltage is applied to the cathode 1. This suppresses emission of thermal electrons from the filament portion. The electron beam 13 emitted from the tip of the cathode 1 is directed onto a fluorescent screen 9, where it forms an electron emission pattern.

The electron source structures of the example and comparative example were incorporated into evaluation apparatus having the above-described electrode structures. The electron emission patterns were observed at the fluorescent portions of the fluorescent screen 9, to check for the presence or absence of electron emissions other than the electron emissions from the tip of the cathode 1.

Next, the test results for the examples and comparative examples are shown in Table 1.

TABLE

| | n | Electron Emission Pattern | Comments |
|---|---|---|---|
| Examples | 1 | ● | Only a circular pattern on the axis. |
| | 2 | ● | Only a circular pattern on the axis. |
| | 3 | ● | Only a circular pattern on the axis. |
| Comparative Examples | 1 | ● | Only a circular pattern on the axis. |
| | 2 | ◢ | Circular pattern on axis + asymmetric pattern |
| | 3 | ● | Circular pattern on axis + abnormal polar pattern |

<Analysis>

In all of the examples, no electron emissions were observed apart from the circular electron emission pattern on the central axis formed by electrons emitted from the tip of the cathode. Thus, the thermal electrons from the filaments were suppressed by the suppressor.

On the other hand, in the comparative examples, two out of three had electron emission patterns from sources other than the electron emissions from the tip of the cathode. This is believed to be due to the fact that the cathode was slightly displaced when the cathode was heated, as a result of which the suppressor was not able to adequately achieve the effect of suppression of the thermal electrons.

INDUSTRIAL APPLICABILITY

The electron source of the present invention has a specific structure making it less susceptible to the effects of external vibrations, and enabling it to generate a highly reliable and stable electron beam, so it can be applied to various electron beam applications such as scanning electron microscopy, Auger electron spectroscopy, electron beam lithography and wafer inspection equipment, and is extremely useful to industry.

The invention claimed is:

1. An electron source characterized by comprising a cathode having an electron emitting portion, connected between tips of two filaments respectively affixed to two conductive terminals provided on insulator, an end of said cathode different from the electron emitting portion being anchored to said insulator, and said two filaments having 2-fold rotational symmetry with respect to a central axis of said cathode.

2. An electron source in accordance with claim 1, wherein said end of the cathode different from the electron emitting portion is anchored to said insulator by a metallic member brazed to said insulator.

3. An electron source in accordance with claim 1, wherein said two filaments are each provided with a curved portion between a portion of connection to said cathode and a portion affixed to said conductive terminals.

4. An electron source in accordance with claim 1, wherein said cathode is composed of molybdenum or tungsten monocrystals in the <100> orientation, and a portion of said cathode has an oxide of a metal element chosen from among Ca, Sr, Ba, Sc, Y, La, Ti, Zr, Hf and the lanthanoids as a reservoir.

* * * * *